United States Patent
Prakash et al.

(10) Patent No.: US 11,574,690 B2
(45) Date of Patent: Feb. 7, 2023

(54) SEQUENTIAL WORDLINE ERASE VERIFY SCHEMES

(71) Applicant: Micron Technology, Inc., Boise, ID (US)

(72) Inventors: Ronit Roneel Prakash, Hiratsuka (JP); Jiun-Horng Lai, Kamakura (JP); Chengkuan Yin, Tokyo (JP); Shinji Sato, Sagamihara (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/335,132

(22) Filed: Jun. 1, 2021

(65) Prior Publication Data
US 2022/0383963 A1 Dec. 1, 2022

(51) Int. Cl.
*G11C 16/34* (2006.01)
*G11C 16/04* (2006.01)

(52) U.S. Cl.
CPC ...... *G11C 16/3445* (2013.01); *G11C 16/0483* (2013.01)

(58) Field of Classification Search
CPC .............. G11C 16/3445; G11C 16/0483
USPC ........................................... 365/185.22
See application file for complete search history.

(56) References Cited

U.S. PATENT DOCUMENTS

| 9,704,579 B1 * | 7/2017 | Bayle | G11C 16/14 |
|---|---|---|---|
| 11,037,632 B1 * | 6/2021 | Ku | G11C 16/08 |
| 2015/0117114 A1 * | 4/2015 | Wan | G11C 16/3459 365/185.21 |
| 2022/0028460 A1 * | 1/2022 | Kurose | G06F 3/064 |
| 2022/0199174 A1 * | 6/2022 | Song | G11C 16/16 |

* cited by examiner

*Primary Examiner* — Fernando Hidalgo
(74) *Attorney, Agent, or Firm* — Lowenstein Sandler LLP

(57) ABSTRACT

A system includes a memory device including a memory array including a plurality of wordline groups and control logic, operatively coupled with the memory array, to perform operation including causing a first erase verify to be performed sequentially with respect to each wordline group of the plurality of wordline groups, identifying a set of failing wordline groups determined to have failed the first erase verify, and causing a second erase verify to be performed sequentially with respect to each wordline group of the set of failing wordline groups.

20 Claims, 7 Drawing Sheets

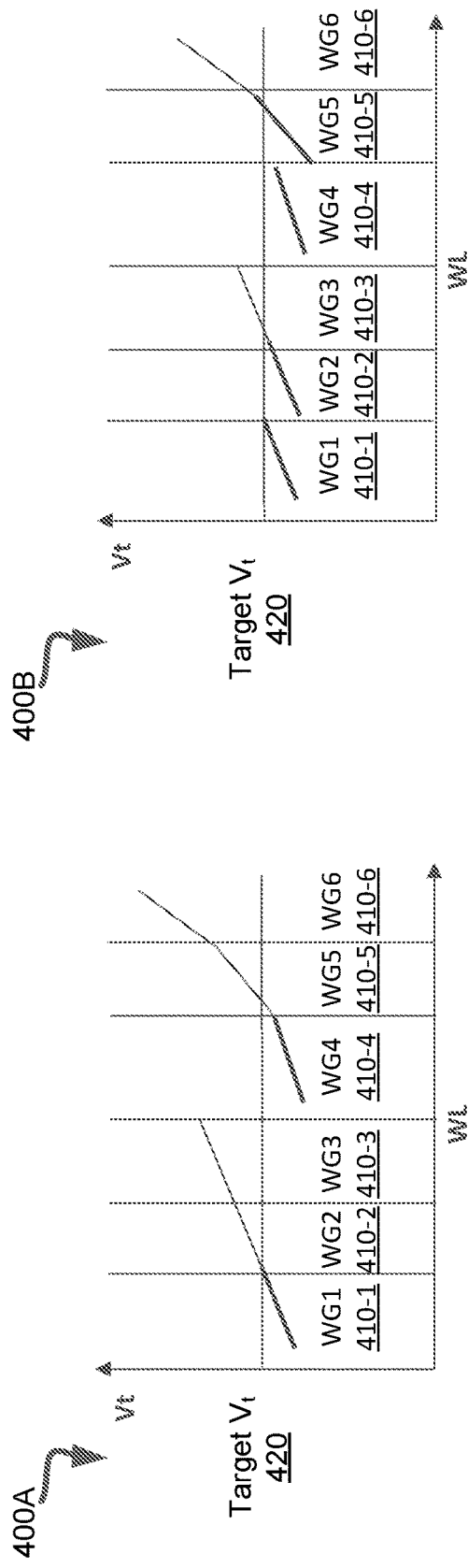
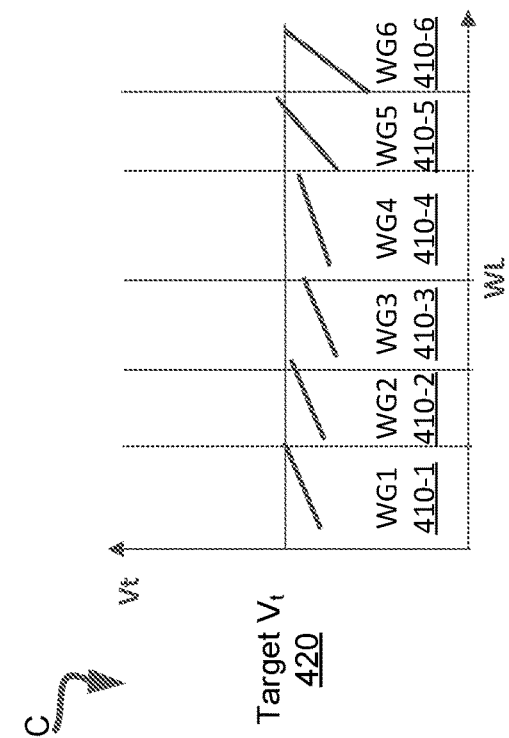
FIG. 4A
FIG. 4B
FIG. 4C

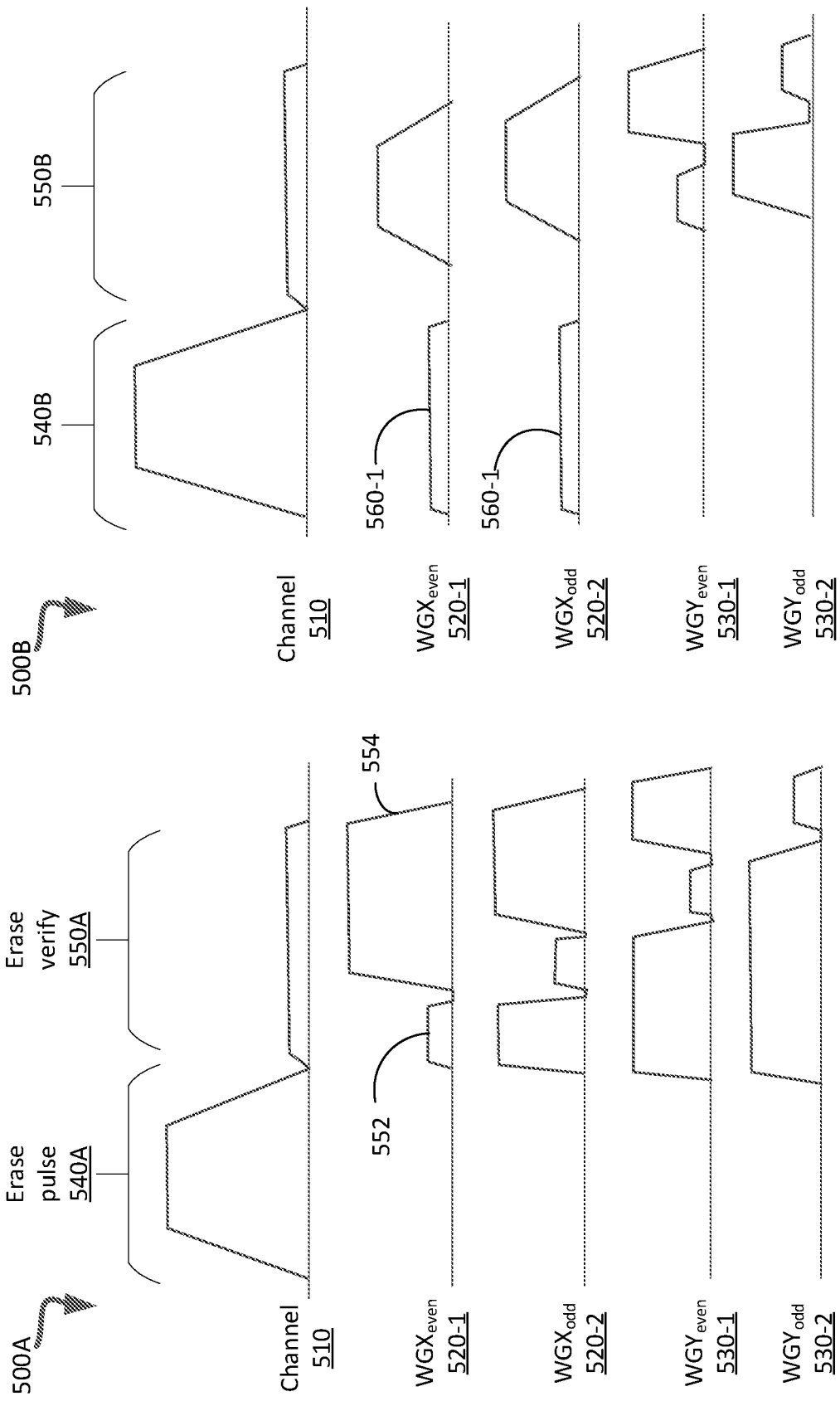

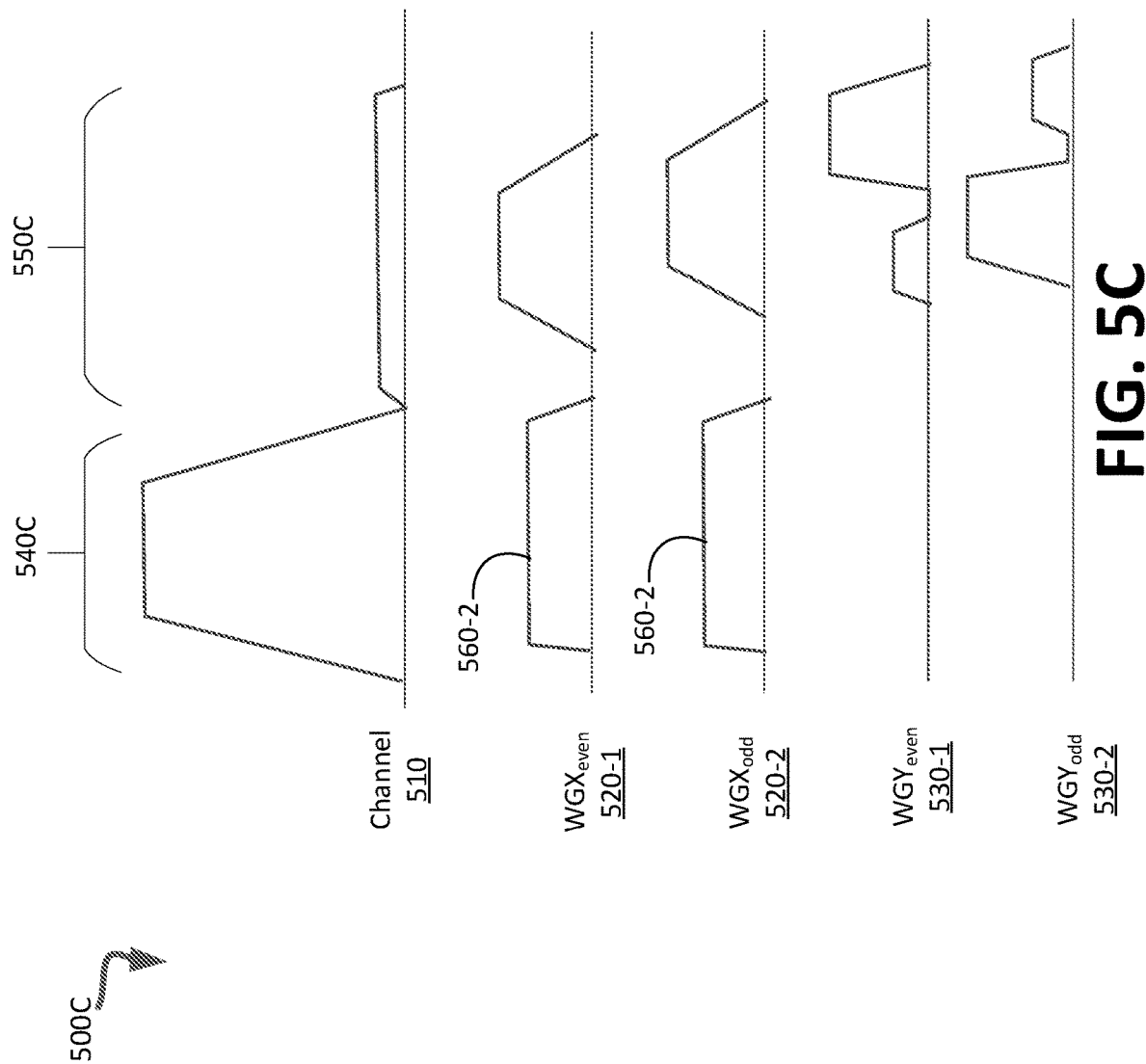

SEQUENTIAL WORDLINE ERASE VERIFY SCHEMES

TECHNICAL FIELD

Embodiments of the disclosure relate generally to memory sub-systems, and more specifically, relate to sequential wordline erase verify schemes.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 4A-4C are graphs illustrating the operation of a sequential wordline erase verify scheme during respective erase loops in accordance with some embodiments of the present disclosure.

FIGS. 5A-5C are waveform diagrams illustrating the operation of a sequential wordline erase verify scheme during respective erase loops in accordance with some embodiments of the present disclosure.

DETAILED DESCRIPTION

Figure 1:
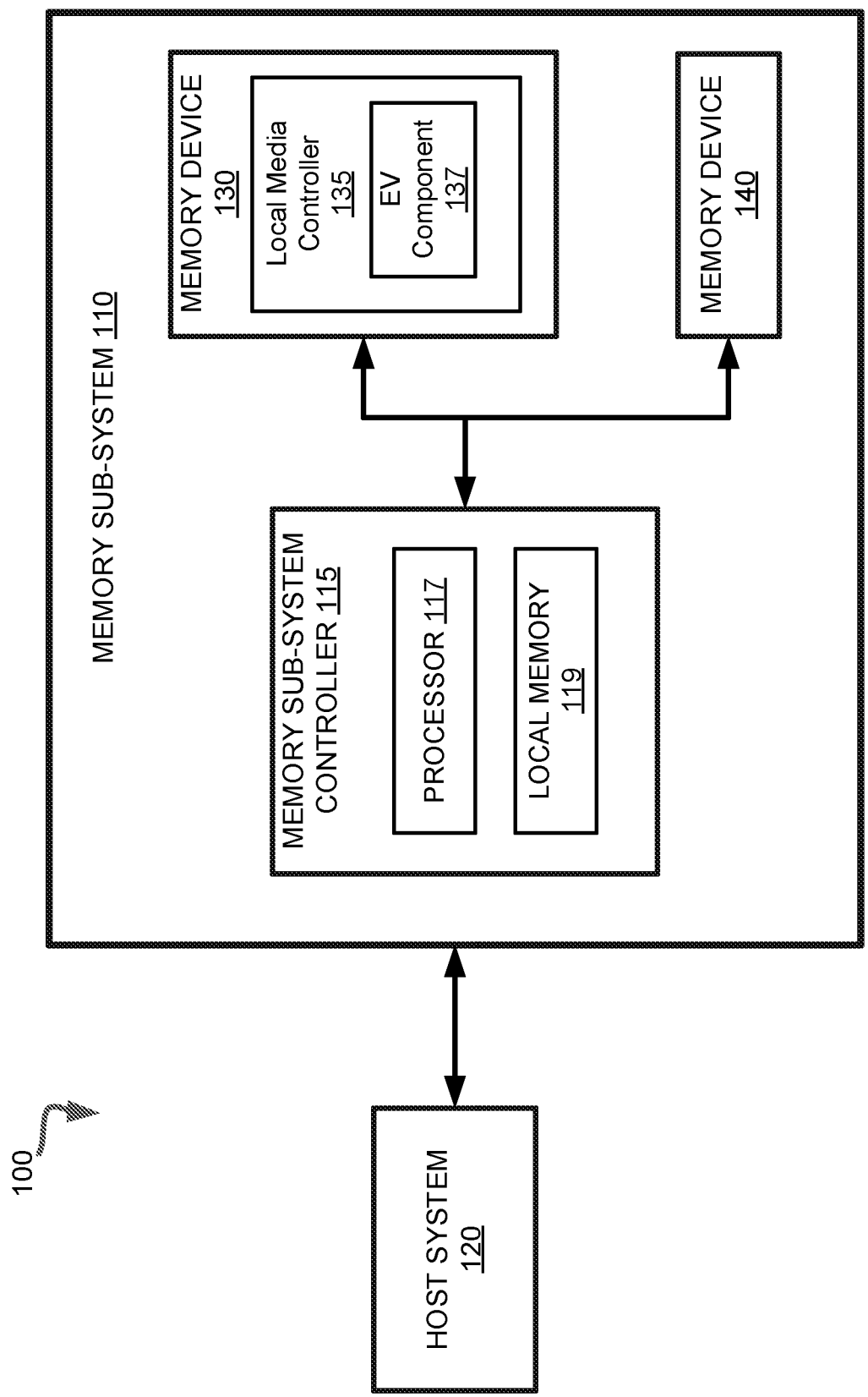
FIG. 1 illustrates an example computing system that includes a memory sub-system in accordance with some embodiments of the present disclosure.

Aspects of the present disclosure are directed to sequential wordline erase verify schemes. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple bits arranged in a two-dimensional or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A three-dimensional (3D) replacement gate memory device (e.g., 3D replacement gate NAND) is a memory device with a replacement gate structure using wordline stacking. For example, a 3D replacement gate memory device can include wordlines, select gates, etc. sandwiched between sets of layers including a channel (e.g., polysilicon channel), a tunnel oxide layer, a charge trap (CT) layer, and a dielectric (e.g. oxide) layer. A 3D replacement gate memory device can have a "top deck" corresponding to the source side and a "bottom deck" corresponding to the drain side. Data in a 3D replacement gate memory device can be stored as 1 bit/cell (SLC), 2 bits/cell (MLC), 3 bits/cell (TLC), etc. Read window budget (RWB) margin corresponding to the distance between valleys of a threshold voltage distribution can decrease as the number of bits/cell increases.

Erase verify is a process performed during erase operations. In some devices, such as three-dimensional (3D) replacement gate memory devices (e.g., 3D replacement gate NAND), there can be a large difference in erase speed across wordlines or pages (e.g., due to the shape of pillars). Such a difference in erase speed can lead to large erase depth or stress variations across memory cells corresponding to shallow erased wordlines ("shallow erased memory cells") and memory cells corresponding to deep erased wordlines ("deep erased memory cells"), where shallow erased memory cells are memory cells that are erased slower than deep erased memory cells. In comparison to average memory cells, after an erase operation, shallow erased memory cells have a higher erase threshold voltage ($V_t$) while deep erased memory cells have a lower erase $V_t$. After the erase operation, the erase $V_t$ of shallow erased memory cells are closer to the erase verify level, while deep erased memory cells have a much lower erase $V_t$. For example, an erase $V_t$ difference between shallow erased memory cells and deep erased memory cells, can exceed, e.g., 850 mV. This means that deep erased memory cells can endure larger erase stress during program/erase cycles as compared to shallow erased memory cells, and can thus lead to rapid degradation and worse data retention. Moreover, it can be difficult to erase shallow erased memory cells deeper, since doing so can lead to further degradation of the deep erased memory cells. Deep erasing can also cause erase $V_t$ widening and can negatively affect read window budget (RWB). Even though all memory cells are erase verified after an erase pulse, the decision to continue erasing or to stop erasing can depend on the erase $V_t$'s from the shallowest erased memory cells, since the erase $V_t$'s from the deepest erased memory cells can be far from the erase verify target when near the verify pass condition. That is, only shallow erased memory cells are effectively verified, while the erase $V_t$'s of the deep erased memory cells are not controlled. Therefore, since the erase verify can depend mainly on post-erase $V_t$'s of shallow erased memory cells, erase verify operations cannot effectively verify all memory cells.

Aspects of the present disclosure address the above and other deficiencies by implementing sequential wordline erase verify schemes to improve erase depth uniformity. For example, the erase verify schemes described herein can be implemented to perform erase verify within the context of 3D replacement gate memory devices (e.g., 3D replacement gate NAND). More specifically, the sequential wordline erase verify schemes described herein can verify and inhibit wordline groups (WG's) of memory cells independently, so erase depth of all memory cells of their respective WG's can depend on their respective erase speeds. To inhibit WG's, the sequential wordline erase verify schemes described herein can apply an inhibiting bias voltage to WG's having wordlines that had passed erase verify during a prior erase loop. The inhibiting bias voltage can be adjusted according to erase speed of all WG's, so erase depth variations by WG's across blocks, units, wafers, temperatures and program/erase cycles is reduced. Therefore, the sequential wordline erase verify schemes described herein can prevent over-erase of faster-to-erase deep memory cells while enabling deeper erase on slower-to-erase shallow memory cells, thereby enabling the memory cells of the WG's to have closer erase $V_t$'s. Accordingly, a smaller erase $V_t$ difference and improved erase depth uniformity can be achieved.

Advantages of the present disclosure include, but are not limited to, improved stress variation across wordlines, improved erase depth uniformity and/or reduced erased depth variations across wordlines that can be maintained across program/erase cycles, temperatures, etc., and improved reliability (e.g., after program/erase cycle data retention).

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can implement an erase verify (EV) component 137 that can perform sequential wordline erase verify schemes for erase depth uniformity. The EV component 137 can, for an erase loop, cause an erase pulse at an erase bias voltage ($V_{era}$) to be applied on a channel and an inhibiting bias voltage to be applied on certain wordlines (e.g., 0 V). More specifically, the erase pulse can be applied to the source and bitline so that the channel potential increases. For example, the channel can be a NAND channel. In some embodiments, $V_{era}$ can be range from about 15 V to about 20 V. After the erase pulse is applied, erase verify can be performed to sequentially erase verify with respect to WG's in a manner that enables independent verification of all memory cells of the wordlines of the WG's. In some embodiments, sub-blocks corresponding to subdivisions of a block are independently verified. For example, a given sub-block can include a vertical string coupled to a bitline.

In some embodiments, the sequential wordline erase verify schemes performed by the EV component 137 are simultaneously applied with respect to wordlines within a WG (i.e., to all memory cells corresponding to wordlines within a WG). In some embodiments, the sequential wordline erase verify schemes performed by the EV component 137 are applied with respect to alternating wordlines within a WG. As an illustrative example, erase verify can first be performed with respect to even numbered wordlines of a first WG, then with respect to odd numbered wordlines of the first WG, then with respect to even numbered wordlines of a second WG, then with respect to odd numbered wordlines of the second WG, etc.

If all WG's have memory cells that pass erase verify, then the erase operation can end. Otherwise, there will be a set of passing WG's and a set of failing WG's, and an inhibiting bias voltage can be applied with respect to the WG's of the set of passing WG's prior to initiating the next erase loop (e.g., prior to applying the erase pulse of the next erase loop). The EV component 137 can iterate through a sufficient number of erase loops, including applying inhibiting bias voltages with respect to all passing WG's, until all WG's pass erase verify. Further details regarding the operations of the EV component 137 will be described below with reference to FIG. 3.

Figure 2:
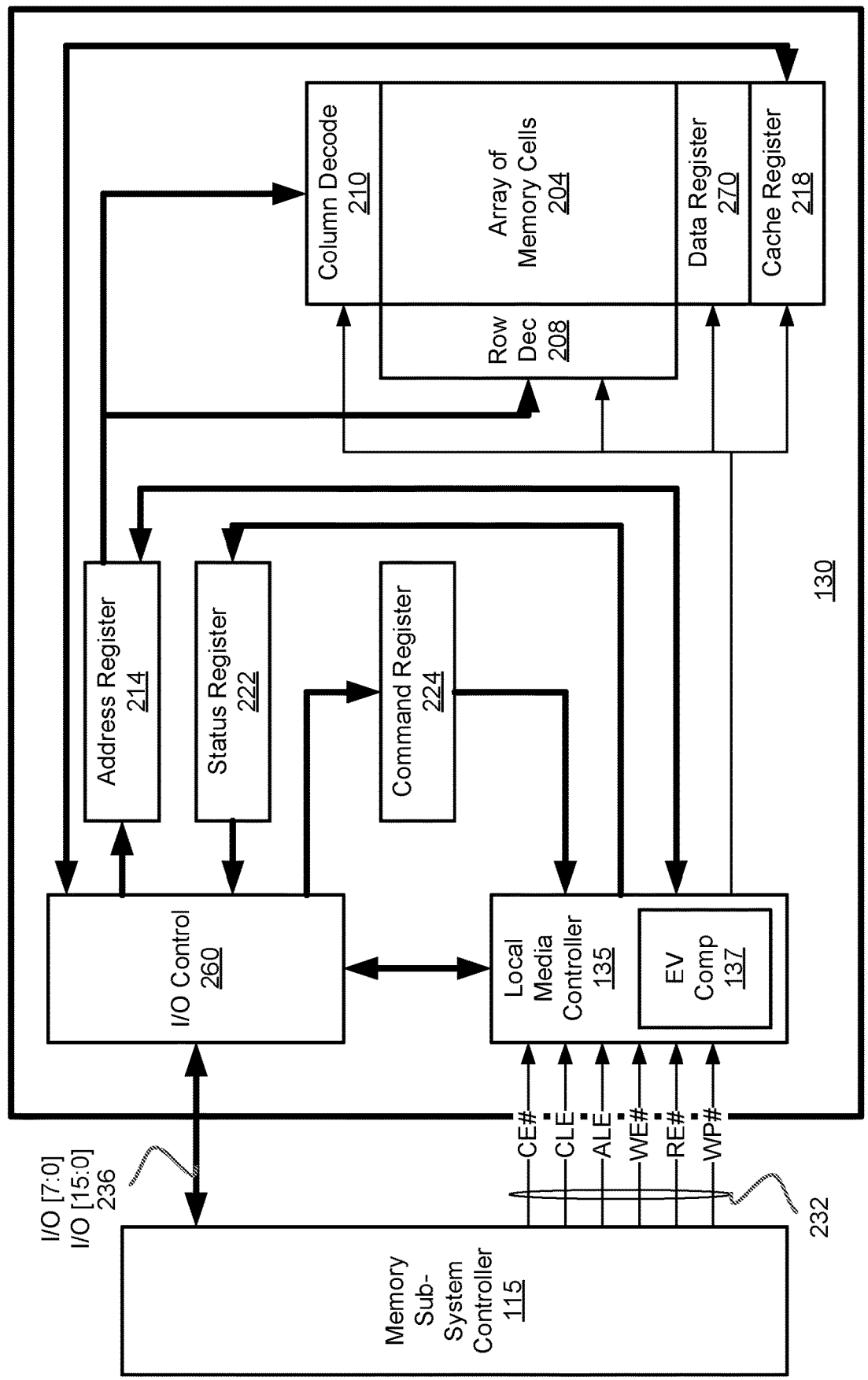
FIG. 2 is a block diagram of a memory device in communication with a memory sub-system controller of a memory sub-system in accordance with some embodiments of the present disclosure.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 260 to manage input of commands, addresses and data to the memory device 130 as well as output of data and status information from the memory device 130. An address register 214 is in communication with I/O control circuitry 260 and row decode circuitry 208 and column decode circuitry 210 to latch the address signals prior to decoding. A command register 224 is in communication with I/O control circuitry 260 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 135 includes the EV component 137, which can implement the sequential wordline erase verify schemes described herein during an erase operation on memory device 130.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 270 for transfer to the array of memory cells 204; then new data may be latched in the cache register 218 from the I/O control circuitry 260. During a read operation, data may be passed from the cache register 218 to the I/O control circuitry 260 for output to the memory sub-system controller 115; then new data may be passed from the data register 270 to the cache register 218. The cache register 218 and/or the data register 270 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 260 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 260 and may then be written into command register 224. The addresses may be received over input/output (I/O) pins [7:0] of I/O bus 236 at I/O control circuitry 260 and may then be written into address register 214. The data may be received over input/output (I/O) pins [7:0] for an 8-bit device or input/output (I/O) pins [15:0] for a 16-bit device at I/O control circuitry 260 and then may be written into cache register 218. The data may be subsequently written into data register 270 for programming the array of memory cells 204.

In an embodiment, cache register 218 may be omitted, and the data may be written directly into data register 270. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

Figure 3:
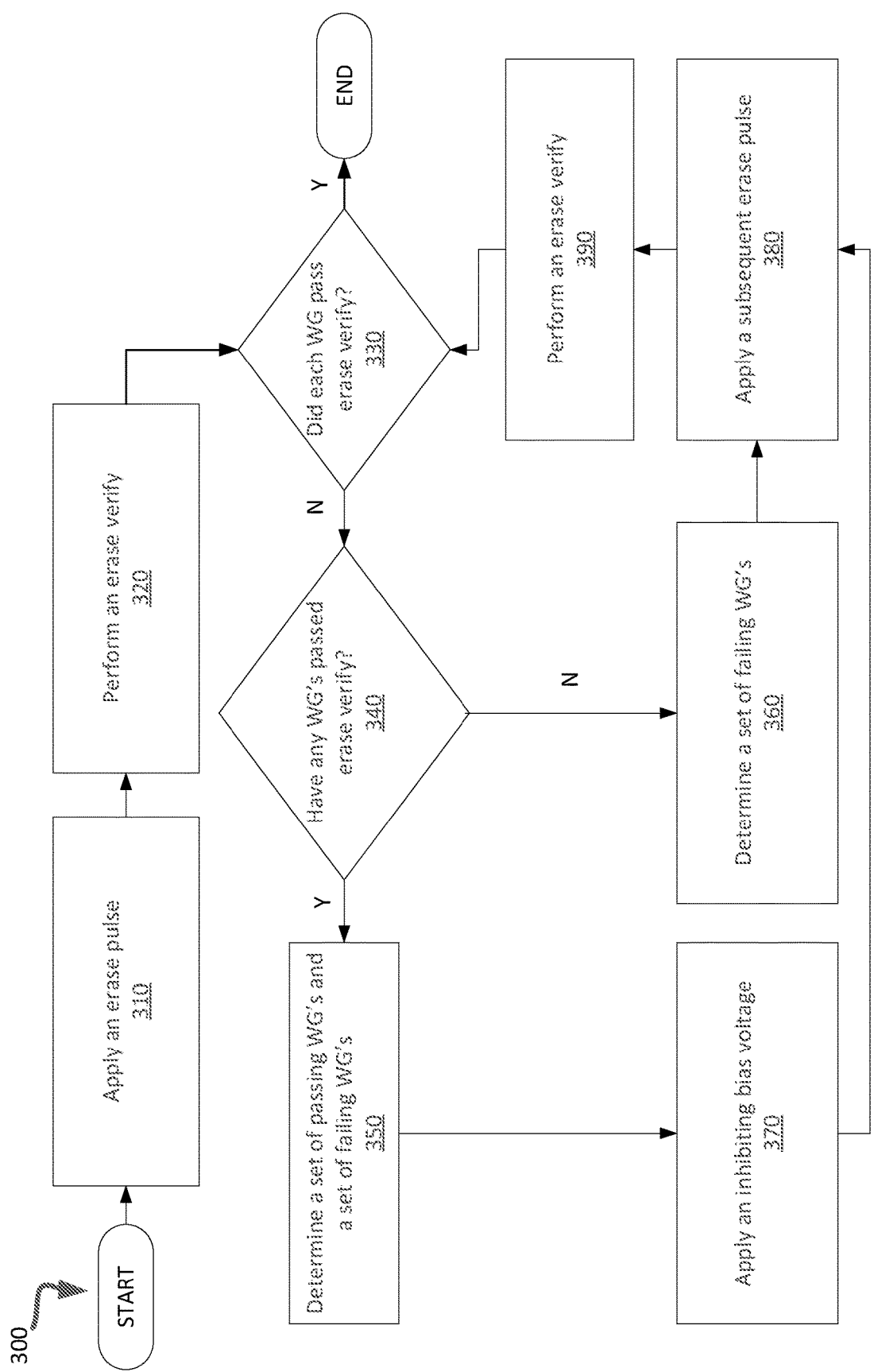
FIG. 3 is a flow diagram of a method to perform sequential wordline erase verify schemes in accordance with some embodiments of the present disclosure.

FIG. 3 is a flow diagram of an example method 300 to perform sequential wordline erase verify schemes for erase depth uniformity in accordance with some embodiments of the present disclosure, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the EV component 137 of FIGS. 1 and 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. In some embodiments, the method 300 can be implemented to perform erase verify with respect to a 3D replacement gate memory device (e.g., 3D replacement gate NAND).

At operation 310, an erase pulse is applied. For example, the processing logic (e.g., EV component 137 implemented by local media controller 135) causes the erase pulse to be applied to a channel during an erase loop. More specifically, the erase pulse can be applied to the source and bitline so that the channel potential increases. For example, the channel can be a NAND channel. More specifically, the erase pulse can be applied at an erase bias voltage ($V_{era}$). For example, $V_{era}$ can range from about 15 V to about 20 V.

At operation 320, an erase verify is performed. For example, the processing logic causes the erase verify to be performed sequentially with respect to wordline groups (WG's) of a memory array of a memory device. For example, the memory device can be the memory device 130 of FIG. 1. More specifically, wordlines associated with memory cells can be partitioned into WG's prior to the erase verify. The boundaries of each WG can be determined based on an analysis of a "closeness" of erase $V_t$ values associated with consecutive wordlines. For example, if the erase $V_t$ values associated with consecutive wordlines are relatively close (e.g., within a threshold range of each other), then those wordlines can be grouped together. However, if there is a large difference between the erase $V_t$ value with respect to one wordline and the erase $V_t$ value with respect to a next wordline (e.g., larger than a given threshold), this can be a sign that a new WG can be formed starting with the next wordline. Accordingly, the WG's can be pre-characterized prior to application of the erase pulse.

Erase verify can be performed with respect to WG's sequentially in a manner that enables independent verification of all WG's based on a target erase $V_t$ (e.g., by sub-blocks). If all WG's pass erase verify (e.g., all of memory cells pass erase verify), then the erase operation can end. Otherwise, there will be a first set of passing WG's and a first set of failing WG's. In some embodiments, the erase verify is simultaneously applied with respect to all wordlines within a WG. In some embodiments, the erase verify is applied with respect to alternating wordlines within a WG. As an illustrative example, erase verify can first be performed with respect to even numbered wordlines of a first WG, then with respect to odd numbered wordlines of the first WG, then with respect to even numbered wordlines, then with respect to odd numbered wordlines of the second WG, etc.

At operation 330, an erase verify passing determination is made. For example, the processing logic determines whether each WG passed the erase verify. A WG is determined to have passed the erase verify if all erase $V_t$ values corresponding to the WG are less than or equal to an target erase $V_t$, and a WG is determined to have failed the erase verify if at least one erase $V_t$ value corresponding to the WG is greater than the target erase $V_t$. If each WG is determined to have passed the erase verify at operation 330, this means that no more erase loops need to be performed and the erase verify process ends.

Otherwise, if at least one WG is determined to have failed the erase verify then, at operation 340, the processing logic determines if any WG's have passed erase verify at operation 340. If so, the processing logic determines a set of passing WG's and a set of failing WG's at operation 350. More specifically, the set of passing WG's can include WG's determined to have passed the erase verify at operation 330, and the set of failing WG's can include WG's determined to have failed the erase verify at operation 330. If no WG's have been determined to pass erase verify, this means that every WG has failed erase verify. As such, at operation 360, the processing logic determines a set of failing WG's.

If the processing logic determines a set of passing WG's and a set of failing WG's at operation 350, then, at operation 370, an inhibiting bias voltage is applied. For example, the processing logic causes an inhibiting bias voltage to be applied with respect to the set of passing WG's based on the erase bias voltage and a subsequent erase bias voltage. The inhibiting bias voltage inhibits the memory cells of the set of passing WG's from being erased during a subsequent erase loop. The subsequent erase bias voltage can have a higher magnitude than the previous erase bias voltage.

The inhibiting bias voltage can be proportional to a multiple of $\Delta V_{era}$, which corresponds to the difference between the previously applied erase bias voltage applied during the previous erase loop and the subsequent erase bias voltage to be applied during the subsequent erase loop. In some embodiments, the inhibiting bias voltage is set to $\Delta V_{era}+c$, where c is an additional bias value. The additional bias value is added to ensure proper inhibition with respect to each WG of the set of passing WG's.

In some embodiments, the additional bias value is an adjustable incremental value. The adjustable incremental value is chosen to be sufficiently large enough to ensure proper inhibition within a given erase loop. The adjustable incremental value can be adjusted to account for variations during the erase verify process. For example, the adjustable incremental value may need adjustment based on the duration of the erase pulse and/or memory cell erase characteristics. Thus, the adjustable incremental value can be predetermined based on such an evaluation. The adjustability of the adjustable incremental value can increase complexity as it would necessitate a different inhibiting bias with respect to different WG's during erase.

In some embodiments, the additional bias value is a static value. In these embodiments, the additional bias value can be chosen to be a sufficiently large value that can account for virtually all variations during the erase verify process. However, a larger, static value can introduce errors at WG boundaries. Accordingly, although less complex than the adjustable incremental value, a larger static value can result in lower accuracy as compared to the adjustable incremental value.

At operation 380, a subsequent erase pulse is applied. For example, the processing logic causes a subsequent erase pulse at the subsequent erase bias voltage to be applied to the channel during a subsequent erase loop. More specifically, the subsequent erase pulse can be applied at a voltage of $V_{era}+\Delta V_{era}$. Since an inhibiting bias voltage has been applied with respect to any WG's determined to have passed erase verify at operation 370, the erase $V_t$'s with respect to the inhibited WG's are not affected by the subsequent erase pulse.

At operation 390, a subsequent erase verify is performed. For example, the processing logic causes the subsequent erase verify to be performed sequentially on the WG's of the set of failing WG's, similar to operation 320. The process then reverts to operation 330 to determine whether each WG of the set of failing WG's has passed erase verify. If so, the process ends. If not, then it is determined at operation 340 if any WG's of the set of failing WG's have passed erase verify. If at least one WG of the set of failing WG's has passed erase verify, then a subsequent set of passing WG's and a subsequent set of failing WG's are determined at operation 350. More specifically, the subsequent set of passing WG's includes the WG's of the previous set of passing WG's and any new WG's that have determined to have passed during the subsequent erase loop. Otherwise, a subsequent set of failing WG's is determined at operation 360.

At operation 370, an inhibiting bias voltage is applied. For example, the processing logic causes the inhibiting bias voltage to be applied with respect to the subsequent set of passing WG's. More specifically, the inhibiting bias voltage is re-applied with respect to the previously passing WG's and applied with respect to the newly added passing WG's. For example, if the inhibiting bias voltage is $\Delta V_{era}+c$, then an inhibiting bias voltage of $2\Delta V_{era}+c$ can be applied with respect to the previously passing WG's, and an inhibiting bias voltage of $\Delta V_{era}+c$ can be applied with respect to the newly added passing WG's. The process can then continue to operations 380 and 390 as described above to determine if each WG of the subsequent set of failing WG's has passed erase verify at operation 330. Further details regarding operations 310-390 will now be described below with reference to FIGS. 3-4.

FIG. 4A is a graph 400A illustrating the operation of a sequential wordline erase verify scheme during a first erase loop in accordance with some embodiments of the present disclosure, FIG. 4B is a graph 400B illustrating the operation of a sequential wordline erase verify scheme during a second erase loop in accordance with some embodiments of the present disclosure, and FIG. 4C is a graph 400C illustrating the operation of a sequential wordline erase verify scheme during a third erase loop in accordance with some embodiments of the present disclosure. Each of the graphs 400A-C has an x-axis indicating wordlines (WL), and a y-axis indicating erase threshold voltage ($V_t$). A number of wordline groups (WG's) are shown, including WG1 410-1, WG2 410-2, WG3 410-3, WG4 410-4, WG5 410-5 and WG6 410-6. Moreover, a line is shown indicating a target erase $V_t$, target $V_t$ 420.

Referring to graph 400A, it is assumed in this example that the first erase loop shown is an initial erase loop. Thus, the WG's 410-1 through 410-6 are not initially inhibited from being erased. A first erase bias voltage applied with respect to each of the WG's 410-1 through 410-6 during an erase pulse of a first erase loop is $V_{era}$. Then, during an erase verify performed during the first erase loop, erase verify can be performed with respect to each of the WG's 410-1 through 410-6 sequentially in a manner that enables independent verification of all of the WG's 410-1 through 410-6 (e.g., by sub-blocks). In some embodiments, the erase verify is simultaneously applied with respect to all wordlines within one of the WG's 410-1 through 410-6. In some embodiments, the erase verify is applied with respect to alternating wordlines within one of the WG's 410-1 through 410-6. As an illustrative example, erase verify can first be applied with respect to even numbered wordlines of the WG1 410-1, then with respect to odd numbered wordlines of the WG1 410-1, then with respect to even numbered wordlines of the WG2 410-2, then with respect to odd numbered wordlines of the WG2 410-2, etc.

WG1 410-1 and WG4 410-4 have passed erase verify as their associated erase $V_t$ levels are determined to be at or below the target $V_t$ 420. Thus, a first set of passing WG's includes WG1 410-1 and WG4 410-4 and a first set of failing WG's includes WG2 410-2, WG3 410-3, WG5 410-5 and WG6 410-6. Thus, an inhibiting bias voltage of $\Delta V_{era}+c$ can with applied with respect to WG1 410-1 and WG4 410-4, where $\Delta V_{era}$ is the difference between the first erase bias voltage and a second erase bias voltage to be applied during the second erase loop shown in graph 400B, and c is an additional bias (e.g., adjustable incremental value or static value).

Referring now to graph 400B, after the inhibiting voltage is applied with respect to WG1 410-1 and WG4 410-4, an erase bias voltage of $V_{era}+\Delta V_{era}$ is applied to the channel during an erase pulse of a second erase loop. Then, during an erase verify performed during the second erase loop, erase verify can be performed with respect to each of WG2 410-2, WG3 410-3, WG5 410-5 and WG6 410-6 sequentially in a manner that enables independent verification of WG2 410-2, WG3 410-3, WG5 410-5 and WG6 410-6 (similar to graph 400A).

In addition to WG1 410-1 and WG4 410-4, now WG2 410-2 and WG5 410-5 have passed erase verify as their associated erase $V_t$ levels are determined to be at or below the target $V_t$ 420. Thus, a second set of passing WG's includes WG1 410-1, WG2 410-2, WG4 410-4 and WG5 410-5 and a second set of failing WG's includes WG3 410-3 and WG6 410-6. Accordingly, an inhibiting bias voltage of $\Delta V_{era}+c$ can be applied with respect to WG1 410-1, WG2 410-2, WG4 410-4 and WG5 410-5.

At this point, WG1 410-1 and WG4 410-4 have been inhibited by $2\Delta V_{era}+c$ and WG2 410-2 and WG5 410-5 have been inhibited by $\Delta V_{era}+c$. Referring now to graph 400C, after the inhibiting voltage is applied, an erase bias voltage of $V_{era}+2\Delta V_{era}$ is applied to the channel during an erase pulse of a third erase loop. Then, during an erase verify performed during the third erase loop, erase verify can be performed with respect to each of WG3 410-3 and WG6 410-6 sequentially in a manner that enables independent verification of WG3 410-3 and WG6 410-6 (similar to graph 400A and 400B). As shown in graph 400C, in addition to WG1 410-1, WG2 410-2, WG4 410-4 and WG5 410-5, now WG3 410-3 and WG6 410-6 have passed erase verify as their associated erase $V_t$ levels are determined to be at or below the target $V_t$ 420. Thus, all of the WG's 410-1 through 410-6 have passed erase verify and the erase operation is complete.

FIG. 5A is a waveform diagram 500A illustrating the operation of a sequential wordline erase verify scheme during a first erase loop in accordance with some embodiments of the present disclosure, FIG. 5B is a waveform diagram 500B illustrating the operation of a sequential wordline erase verify scheme during a second erase loop in accordance with some embodiments of the present disclosure, and FIG. 5C is a waveform diagram 500A illustrating the operation of a sequential wordline erase verify scheme during a third erase loop in accordance with some embodiments of the present disclosure.

Each of the diagrams 500A-500C depicts a channel 510, an X-th wordline group WGX having an even set of wordlines ($WGX_{even}$) 520-1 and an odd set of wordlines ($WGX_{odd}$) 520-2, and a Y-th wordline group WGY having an even set of wordlines ($WGY_{even}$) 530-1 and an odd set of wordlines ($WGY_{odd}$) 530-2.

Referring to diagram 500A, an erase pulse 540A is applied to channel 510 at an erase bias voltage ($V_{era}$). Then, at some short time after the application of the erase pulse 540A, erase verify 550A is performed sequentially to verify WGX and WGY. For example, $WGX_{even}$ 520-1 can be verified, followed by $WGX_{odd}$ 520-2, then $WGY_{even}$ 530-1, and then $WGY_{odd}$ 530-2. Each erase verify waveform can include a control gate voltage ($V_{eg}$) waveform component and a passthrough voltage ($V_{pass}$) waveform component. For example, WGXeven 520-1 can include a $V_{eg}$ waveform component 552 and a $V_{pass}$ waveform component 554.

Referring now to diagram 500B, it has been determined that WGX has passed erase verify in the first erase loop shown in diagram 500A. Thus, an inhibiting bias voltage is applied to $WGX_{even}$ 520-1 and $WGX_{odd}$ 520-2 to inhibit WGX from being erased during the second erase loop, as represented by waveform 560-1. More specifically, the inhibiting bias voltage can be $\Delta V_{era}+c$ as described above. An erase pulse 540B is applied to channel 510 at an erase bias voltage of $V_{era}+\Delta V_{era}$. Then at some short time after the application of the erase pulse 540B, erase verify 550B is performed sequentially to verify WGY (e.g., $WGY_{even}$ 530-1 and then $WGY_{odd}$ 530-2).

Referring now to diagram 500C, another inhibiting bias voltage is applied to $WGX_{even}$ 520-1 and $WGX_{odd}$ 520-2 to inhibit WGX from being erased during the second erase loop, as represented by waveform 560-2. More specifically, the inhibiting bias voltage can be $2\Delta V_{era}+c$ as described above. An erase pulse 540C is applied to channel 510 at an erase bias voltage of $(V_{era}+\Delta V_{era})+\Delta V_{era}=V_{era}+2\Delta V_{era}$. Here, WGY still has not passed erase verify, which is why it has a similar waveform as shown in FIG. 5B.

Figure 6:
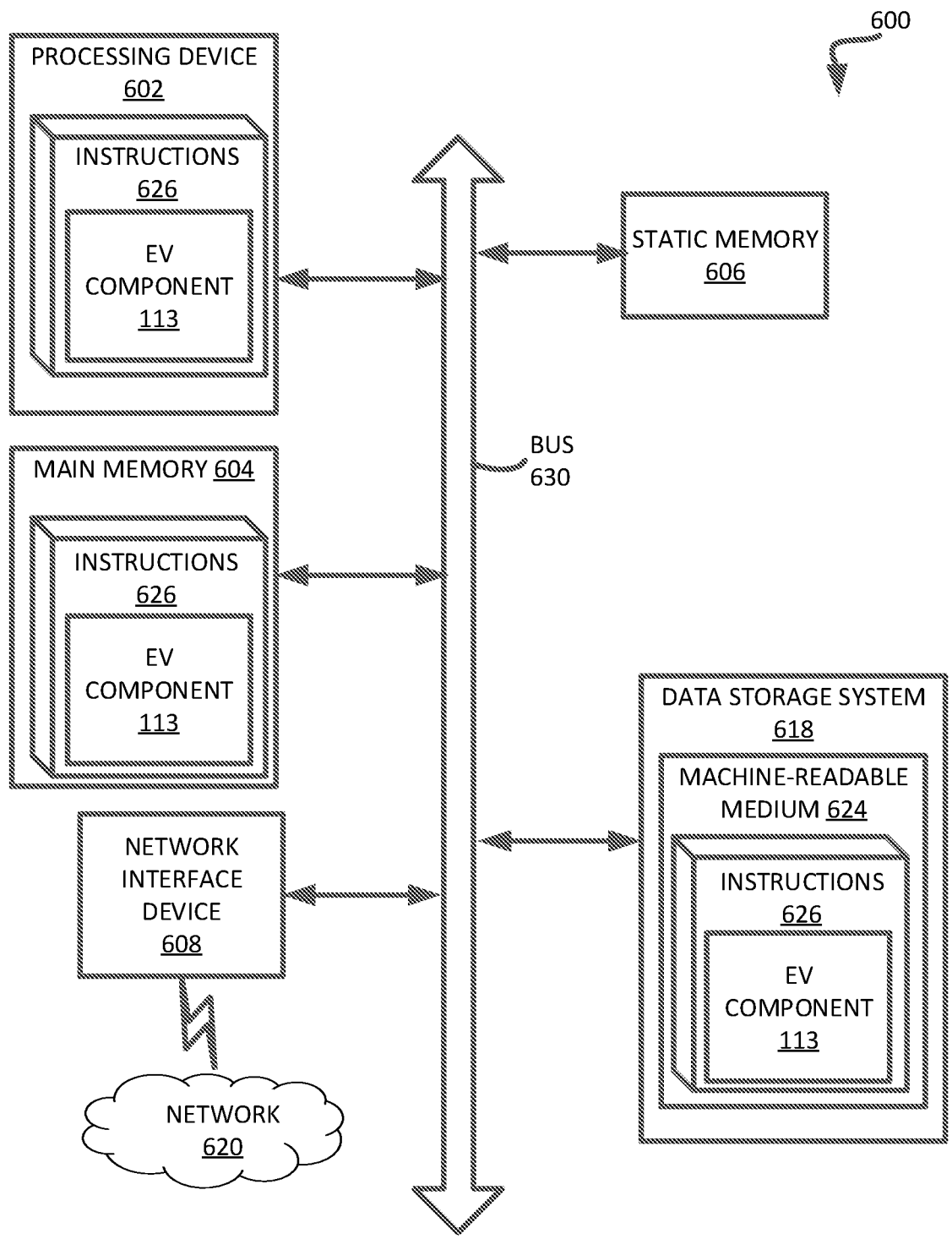
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the EV component 137 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 508 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an EV component (e.g., the EV component 137 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising a block, the block comprising a plurality of wordline groups, wherein each wordline group of the plurality of wordline groups comprises a set of even wordlines and a set of odd wordlines; and
   control logic, operatively coupled with the memory array, to perform operations to implement an erase verify process, the operations comprising:
      causing a first erase verify to be performed sequentially with respect to each wordline group of the plurality of wordline groups;
      identifying a set of failing wordline groups from the plurality of wordline groups, the set of failing wordline groups comprising at least one failing wordline group determined to have failed the first erase verify; and
      causing a second erase verify to be performed sequentially with respect to each failing wordline group of the set of failing wordline groups.

2. The memory device of claim 1, wherein causing the first erase verify to be performed sequentially with respect to each wordline group of the plurality of wordline groups comprises causing the first erase verify to be performed with respect to the set of even wordlines independently from the set of odd wordlines.

3. The memory device of claim 1, wherein the operations further comprise:
   causing a first erase pulse at a first erase bias voltage to be applied to a channel prior to causing the second erase verify to be performed; and
   causing a second erase pulse at a second erase bias voltage greater than the first erase bias voltage to be applied to the channel prior to causing the second erase verify to be performed.

4. The memory device of claim 3, wherein the operations further comprise:
   identifying a set of passing wordline groups, the set of passing wordline groups comprising at least one passing wordline group of the plurality of wordline groups determined to have passed the first erase verify; and
   prior to causing the second erase verify to be performed, causing an inhibiting bias voltage to be applied with respect to each passing wordline group of the set of passing wordline groups, wherein the inhibiting bias voltage is proportional to a difference between the second erase pulse and the first erase pulse.

5. The memory device of claim 4, wherein the inhibiting bias voltage is equal to the difference between the second erase pulse and the first erase pulse plus an additional bias value.

6. The memory device of claim 4, wherein the set of passing wordline groups comprises a passing wordline group with each wordline of the passing wordline group being associated with an erase threshold voltage value less than or equal to a target erase threshold voltage, and wherein the set of failing wordline groups comprises a failing wordline group with each wordline of the failing wordline group being associated with an erase threshold voltage greater than the target erase threshold voltage.

7. The memory device of claim 1, wherein the operations further comprise:
   determining that each failing wordline group of the set of failing wordline groups has passed the second erase verify; and
   causing the erase verify process to terminate in response determining that each failing wordline group of the set of failing wordline groups has passed the second erase verify.

8. The memory device of claim 1, wherein the memory device comprises a three-dimensional replacement gate memory device.

9. A method for implementing an erase verify process, the method comprising:
   causing, by a processing device, a first erase verify to be performed sequentially with respect to each wordline group of a plurality of wordline groups associated with a block of a memory device, wherein each wordline group of the plurality of wordline groups comprises a set of even wordlines and a set of odd wordlines;
   identifying, by the processing device from the plurality of wordline groups, a set of passing wordline groups and a set of failing wordline groups, wherein the set of passing wordline groups comprises at least one passing wordline group determined to have passed the first erase verify, and wherein the set of failing wordline groups comprises at least one failing wordline group determined to have failed the first erase verify;
   causing, by the processing device, an inhibiting bias voltage to be applied with respect to each passing wordline group of the set of passing wordline groups; and
   causing, by the processing device, a second erase verify to be performed sequentially with respect to each failing wordline group of the set of failing wordline groups.

10. The method of claim 9, wherein causing the first erase verify to be performed sequentially with respect to each wordline group of the plurality of wordline groups comprises causing the first erase verify to be performed with respect to the set of even wordlines independently from the set of odd wordlines.

11. The method of claim 9, further comprising:
   causing, by the processing device, a first erase pulse at a first erase bias voltage to be applied to a channel prior to performing the first erase verify; and
   causing, by the processing device, a second erase pulse at a second erase bias voltage greater than the first erase bias voltage to be applied to the channel prior to performing the second erase verify.

12. The method of claim 11, wherein the inhibiting bias voltage is proportional to a difference between the second erase pulse and the first erase pulse.

13. The method of claim 12, wherein the inhibiting bias voltage is equal to the difference between the second erase pulse and the first erase pulse plus an additional bias value.

14. The method of claim 9, wherein the set of passing wordline groups comprises a passing wordline group with each wordline of the passing wordline group being associated with an erase threshold voltage value less than or equal to a target erase threshold voltage, and wherein the set of failing wordline groups comprises a failing wordline group with each wordline of the failing wordline group being associated with an erase threshold voltage greater than the target erase threshold voltage.

15. The method of claim 9, further comprising:
   determining, by the processing device, that each failing wordline group of the set of failing wordline groups has passed the second erase verify; and
   causing, by the processing device, the erase verify process to terminate in response determining that each failing wordline group of the set of failing wordline groups has passed the second erase verify.

16. The method of claim 9, wherein the memory device comprises a three-dimensional replacement gate memory device.

17. A non-transitory computer-readable storage medium comprising instructions that, when executed by a processing device, cause the processing device to perform operations to implement an erase verify process, the operations comprising:
   causing a first erase pulse at a first erase bias voltage to be applied to a channel associated with a memory device;
   after the first erase pulse is applied, causing a first erase verify to be performed sequentially with respect to each wordline group of a set of wordline groups associated with a block of the memory device, wherein each wordline group of the set of wordline groups comprises a set of even wordlines and a set of odd wordlines;
   determining whether each wordline group of the set of wordline groups has passed the first erase verify based on a target erase threshold voltage;
   after determining that at least one wordline group of the set of wordline groups has not passed the first erase verify, identifying at least one failing wordline group determined to have failed the first erase verify;
   causing a second erase pulse to be applied to the channel, the second erase pulse being applied at a second erase bias voltage greater than the first erase bias voltage;
   after causing the second erase pulse to be applied to the channel, causing a second erase verify to be performed sequentially with respect to each failing wordline group;
   determining whether each failing wordline group has passed the second erase verify; and
   in response determining that each failing wordline group has passed the second erase verify, causing the erase verify process to terminate.

18. The non-transitory computer-readable storage medium of claim 17, wherein causing the first erase verify to be performed sequentially with respect to each wordline group of the set of wordline groups comprises causing the first erase verify to be performed with respect to the set of even wordlines independently from the set of odd wordlines.

19. The non-transitory computer-readable storage medium of claim 17, wherein the set of wordline groups comprises one or more wordline groups determined to have failed a previous erase verify based on the target erase threshold voltage.

20. The non-transitory computer-readable storage medium of claim 17, wherein the memory device comprises a three-dimensional replacement gate memory device.

* * * * *